United States Patent [19]

Zhang

[11] Patent Number: 5,236,850
[45] Date of Patent: Aug. 17, 1993

[54] METHOD OF MANUFACTURING A SEMICONDUCTOR FILM AND A SEMICONDUCTOR DEVICE BY SPUTTERING IN A HYDROGEN ATMOSPHERE AND CRYSTALLIZING

[75] Inventor: Hongyong Zhang, Kanagawa, Japan

[73] Assignee: Semiconductor Energy Laboratory Co., Ltd., Kanagawa, Japan

[21] Appl. No.: 761,648

[22] Filed: Sep. 18, 1991

[30] Foreign Application Priority Data

Sep. 25, 1990 [JP] Japan .................. 2-254512

[51] Int. Cl.$^5$ .......................................... H01L 21/266
[52] U.S. Cl. ................................... 437/21; 437/937; 437/967; 148/DIG. 1; 148/DIG. 158
[58] Field of Search .............. 148/DIG. 1, DIG. 122, 148/DIG. 158; 204/192.25; 437/21, 41, 62, 101, 967, 980, 937

[56] References Cited

U.S. PATENT DOCUMENTS

| | | |
|---|---|---|
| 4,217,374 | 8/1980 | Ovshinsky et al. ............ 204/192.25 |
| 4,345,248 | 8/1982 | Togashi et al. ...................... 340/765 |
| 4,379,020 | 4/1983 | Glaeser et al. ............... 148/DIG. 1 |
| 4,468,853 | 9/1984 | Morita et al. ................. 148/DIG. 1 |
| 4,528,082 | 7/1985 | Moustakas et al. ............ 204/192.25 |
| 4,732,659 | 3/1988 | Schacter et al. ............... 204/192.25 |
| 4,777,150 | 10/1988 | Deneuville et al. .......... 148/DIG. 1 |
| 4,900,646 | 2/1990 | Senske et al. ...................... 430/128 |
| 5,034,340 | 7/1991 | Tanaka et al. ......................... 437/41 |
| 5,047,360 | 9/1991 | Nicholas ............................... 437/21 |
| 5,049,523 | 9/1991 | Coleman ............................. 437/101 |

*Primary Examiner*—Brian E. Hearn
*Assistant Examiner*—C. Chaudhari
*Attorney, Agent, or Firm*—Sixbey, Friedman, Leedom & Ferguson

[57] ABSTRACT

A method of manufacturing a semiconductor film and a semiconductor device is disclosed. The method comprises the steps of:

forming a non-single crystal semiconductor film on a surface by sputtering in an atmosphere comprising hydrogen; and crystallizing the non-single crystal semiconductor film at a temperature of 450° C. to 750° C.

21 Claims, 12 Drawing Sheets

METHOD OF MANUFACTURING A SEMICONDUCTOR FILM AND A SEMICONDUCTOR DEVICE BY SPUTTERING IN A HYDROGEN ATMOSPHERE AND CRYSTALLIZING

BACKGROUND OF THE INVENTION

1. Field of the Invention

The present invention relates to a method of manufacturing semiconductor films and semiconductor devices and, more particularly to a method of manufacturing thin film insulated gate field effect transistors consisting of polycrystal semiconductor films.

2. Description of the Prior Art

Conventional polycrystal semiconductor devices utilize polycrystal semiconductor films obtained by thermally crystallizing at 550° to 650° C. for several to several tens hours single-crystal semiconductor films deposited by low pressure CVD or plasma CVD. However, it is difficult to form a uniform non-single crystal semiconductor film on a large surface of a substrate by low pressure CVD. And it takes much time to form a non-single crystal semiconductor film by plasma CVD.

Sputtering on the other hand is excellent in this sense. Particularly, there are following advantages when films are deposited by magnetron sputtering.

1) The surfaces of substrates are less damaged by high energy electrons since the electrons are confined in the vicinity of the target.

2) Wide areas can be coated at lower temperatures at a high deposition rate.

3) No dangerous gas is used so that safety process and practicability are ensured.

The sputtering is carried out without hydrogen because the electric characteristics of amorphous semiconductors deposited by sputtering in an atmosphere comprising hydrogen are not so good. The semiconductor films deposited by the sputtering, however, have a disadvantage that thermal crystallization thereof is very difficult due to existence of microstructure in the semiconductor films, that is, due to maldistribution of silicon atoms or the like.

SUMMARY OF THE INVENTION

It is an object of the present invention to provide a method of manufacturing a semiconductor film with good electric characteristics.

It is another object of the present invention to provide a method of manufacturing a semiconductor device with high performance.

To achieve the foregoing and other object, a non-single crystal semiconductor film is formed on a surface by sputtering in an atmosphere comprising hydrogen and crystallized at a temperature of 450° C. to 750° C. The atmosphere may further comprise an inactive gas, for example argon or helium. The use of hydrogen in the sputtering atmosphere prevents microstructure from being formed in the non-single crystal semiconductor film. Therefore, the non-single crystal semiconductor film can be crystallized by heating it even at a low temperature not higher than 750° C.

The term "non-single crystal semiconductor" includes an amorphous semiconductor, a semi-amorphous semiconductor, a microcrystal semiconductor, and an imperfect polycrystal semiconductor. A microcrystal semiconductor is defined as a semiconductor in an amorphous state in which the crystal state is dispersed. An imperfect polycrystal semiconductor is defined as a semiconductor in a polycrystal state in which the crystal growth is imperfect, that is, crystals can be grown more.

BRIEF DESCRIPTION OF THE DRAWINGS

The accompanying drawings, which are incorporated in and form a part of the invention and, together with the description, serve to explain the principles of the invention.

DETAILED DESCRIPTION OF THE PREFERRED EMBODIMENTS

Figure 1A:
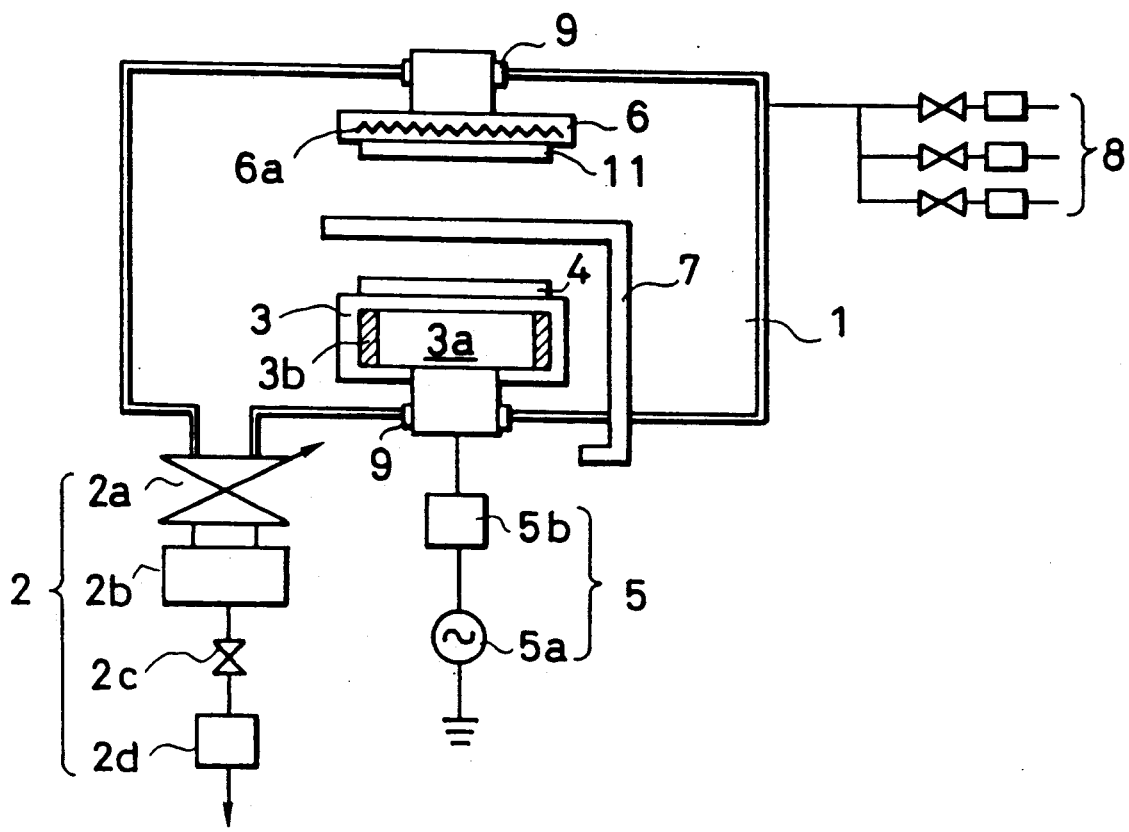
FIG. 1(A) is a schematic view showing a planar type magnetron RF sputtering apparatus suitable for use in manufacturing thin film field effect semiconductor transistors in accordance with the present invention.

Referring to FIG. 1(A), a planar type magnetron RF sputtering apparatus suitable for use in manufacturing semiconductors in accordance with the present invention is illustrated. The apparatus comprises a vacuum chamber 1, an evacuation system 2 consisting of a turbo molecular pump 2b and a rotary pump 2d respectively provided with valves 2a and 2c, a metallic holder 3 fixed in the lower side of the chamber 1 for supporting a target 4 thereon, formed with an inner conduit 3a through which a coolant can flow to cool the target 4 and provided with a number of magnets 3b, an energy supply 5 consisting of an RF (e.g. 13.56 MHz) source 5a provided with a matching box 5b for supplying RF energy to the holder 3, a substrate holder 6 located in the upper portion of the chamber 1 for supporting a substrate 11 to be coated, a heater 6a embedded in the substrate holder 6, a shutter 7 intervening between the substrate 11 and the target 4 and a gas feeding system 8. Reference numeral 9 designates sealing means for ensuring air-tight structure of the vacuum chamber 1. In advance of actual deposition on the substrate 11, impurities occurring in the targets are sputtered and deposited on the shutter intervening between the substrate 11 and the target 4, and then the shutter 7 is removed in order to enable normal deposition on the substrate 11. The magnets 3b are oriented to have their N poles at the upper ends and S poles at the lower ends and horizontally arranged in a circle as illustrated in FIG. 1(B) in order to confine electrons in a sputtering region between the substrate 11 and the target 4.

Referring now to FIGS. 2(A) to 2(E), a method of manufacturing thin film field effect transistors in accordance with a first preferred embodiment of the invention will be described.

Figure 1B:
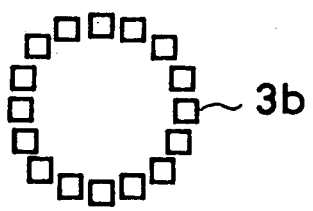
FIG. 1(B) is an explanatory view showing the arrangement of magnets provided in the apparatus as illustrated in FIG. 1(A).

A glass substrate 11 is disposed in the magnetron RF sputtering apparatus shown in FIGS. 1(A) and 1(B) and coated with a $SiO_2$ film 12 to a thickness of 200 nm in a 100% $O_2$ atmosphere (0.5 Pa) at a substrate temperature of 150° C. The output power of the apparatus is 400 W in terms of 13.56 MHz RF energy. A single crystalline silicon is used as a target. An amorphous silicon film is deposited in the sputtering apparatus on the $SiO_2$ film 12 to a thickness of 100 nm. The atmosphere comprises a mixture consisting of hydrogen and argon so that $H_2/(H_2+Ar)=0.8$ in terms of partial pressure. The total pressure is 0.5 Pa: the output power of the apparatus is 400 W in terms of 13.56 MHz RF energy: a single crystalline silicon is used as a target: and the substrate temperature is maintained at 150° C. (deposition temperature) by the heater 6a in the same manner. In preferred embodiments, the hydrogen proportion in the mixture is chosen between 5% and 100%; the deposition temperature between 50° C. and 500° C.: the output power between 100 W and 10 MW in a frequency range from 500 Hz to 100 GHz which may be combined with another pulse energy source.

The amorphous silicon film is then given thermal treatment at a temperature of 450° C. to 750° C., e.g. 600° C. for 96 hours in an inactive atmosphere, e.g. in 100% nitrogen. The film is recrystallized into a polycrystal semiconductor by this treatment.

The semiconductor film is etched to produce a pattern necessary to form a number of transistors in accordance with the following procedure on the substrate 11. The film 13 shown in FIG. 2(A) corresponds to one of the transistors to be formed.

Figure 2A:
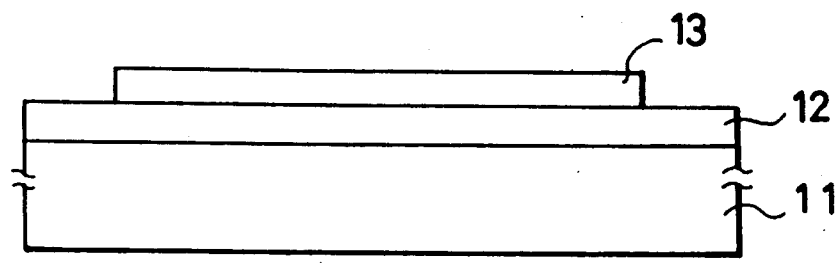
FIGS. 2(A) to 2(E) are cross sectional views showing a method of manufacturing thin film field effect semiconductor transistors in accordance with a first embodiment of the present invention.
Figure 2B:
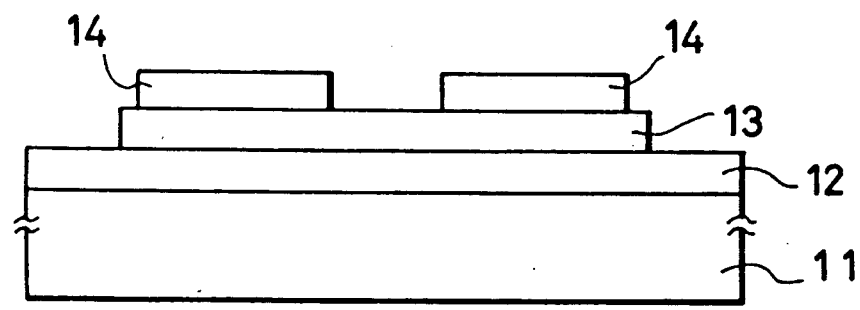

Next, an $n^+$-type amorphous silicon semiconductor film is deposited on the film 13 in the magnetron RF sputtering apparatus to a thickness of 50 nm. The atmosphere comprises a mixture consisting of $H_2$ at 10% to 99% or more, e.g. 80%, Ar at 10% to 99%, e.g. 19% and $PH_3$ at no higher than 10%, e.g. no higher than 1% in terms of partial pressure. The total pressure is 0.5 Pa: the output power of the apparatus is 400 W in terms of 13.56 MHz RF energy: a single crystalline silicon or a non-single crystalline silicon, e.g. a polycrystalline silicon, with a high purity is used as a target: and the substrate temperature in the apparatus is maintained at 150° C. The doping of phosphorus may be performed by another suitable technique such as ion implantation or the use of a target in which phosphorus impurity has been doped in advance. Boron may be used instead of phosphorus as a dopant. The doped semiconductor film is then patterned to form source and drain regions 14 as shown in FIG. 2(B).

Figure 2C:
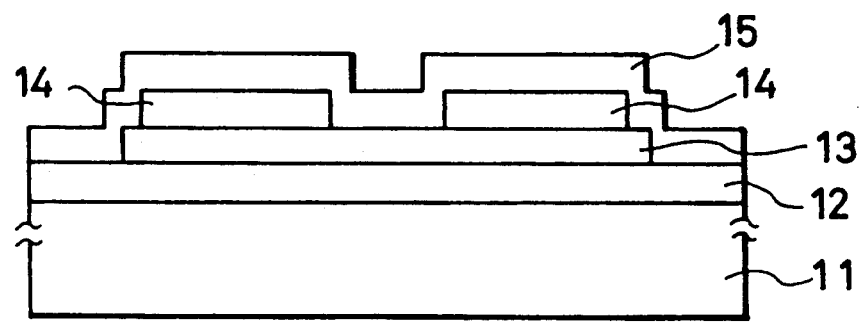

The entire surface of the structure is then coated with a silicon oxide film to a thickness of 100 nm by magnetron RF sputtering as illustrated in FIG. 2(C). The atmosphere comprises a high density oxygen diluted with an inactive gas, preferably, 100% oxygen at 0.5 Pa: the output power of the apparatus is 400 W in terms of 13.56 MHz RF energy: a single crystalline silicon or a silicon dioxide is used as a target: and the substrate temperature is maintained at 100° C.

Figure 2D:
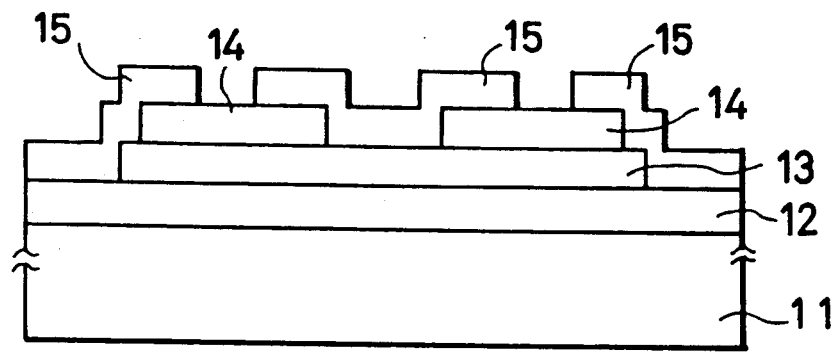
Figure 2E:
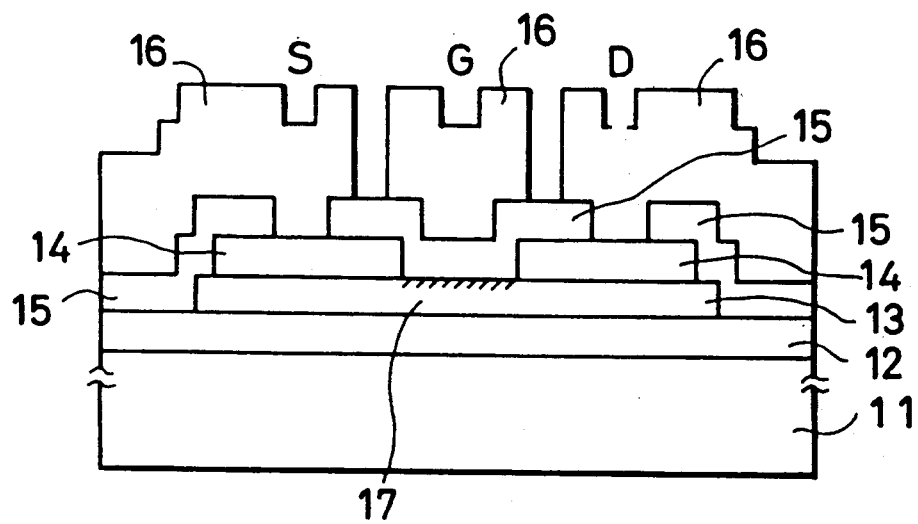

After opening contact holes in the oxide film 15 as shown in FIG. 2(D), an aluminum film 16 is deposited by vapor evaporation to a thickness of 300 nm and patterned in order to form a gate electrode G and source and drain contact electrodes S and D. Finally, the entire structure is subjected to thermal annealing in a 100% hydrogen atmosphere at 375° C. for 30 minutes. The hydrogen thermal annealing is carried out for the purpose of lowering interfacial potentials and improving device characteristics. As a result, a thin film transistor is formed with a channel region of $100\mu m \times 100\mu m$. The property of the transistor has been examined as described below.

Figure 3A:
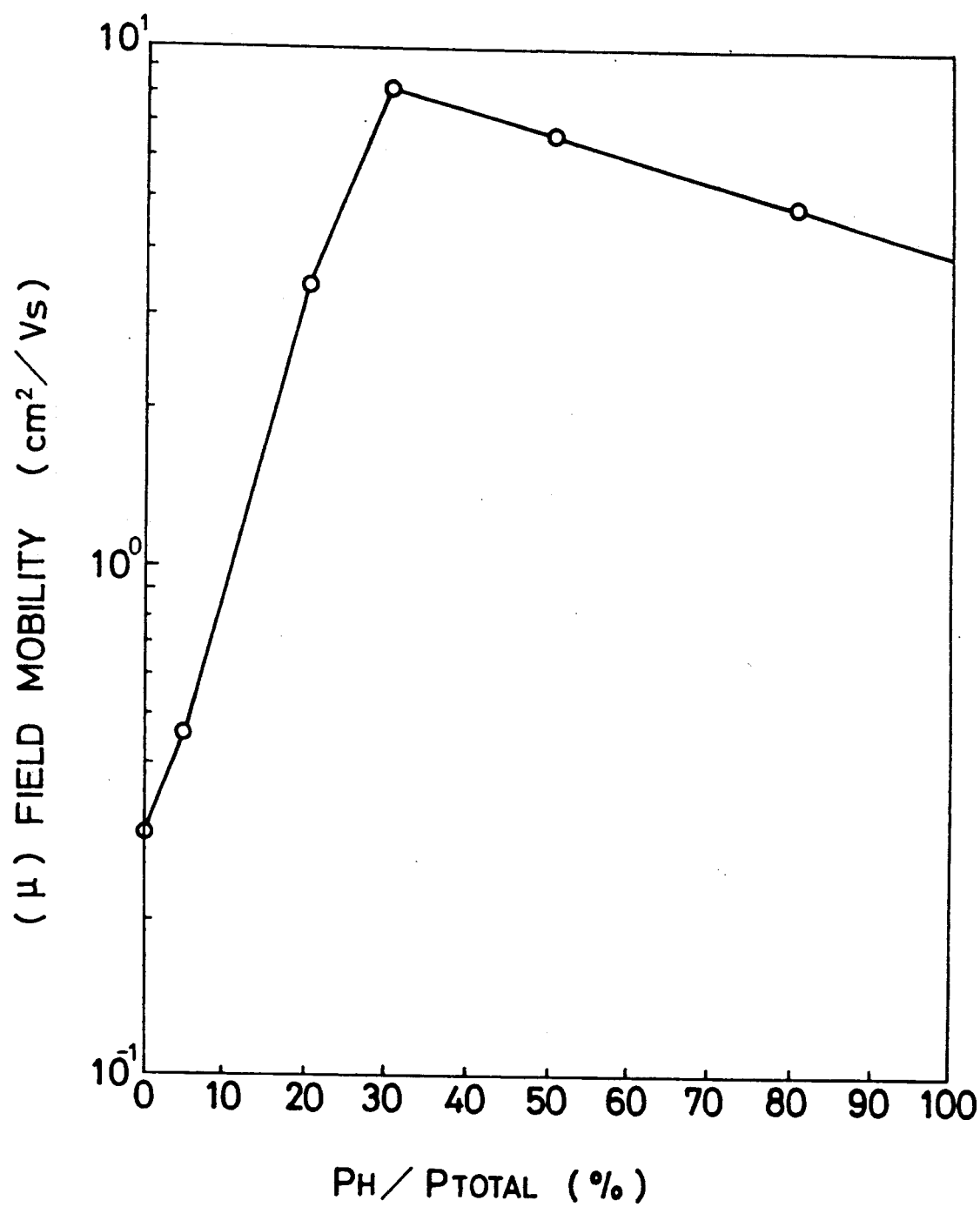
FIG. 3(A) is a graphical diagram showing the relationship between the partial pressure of hydrogen in the atmosphere in which semiconductor films are deposited and the field mobility of the semiconductor film.
Figure 3B:
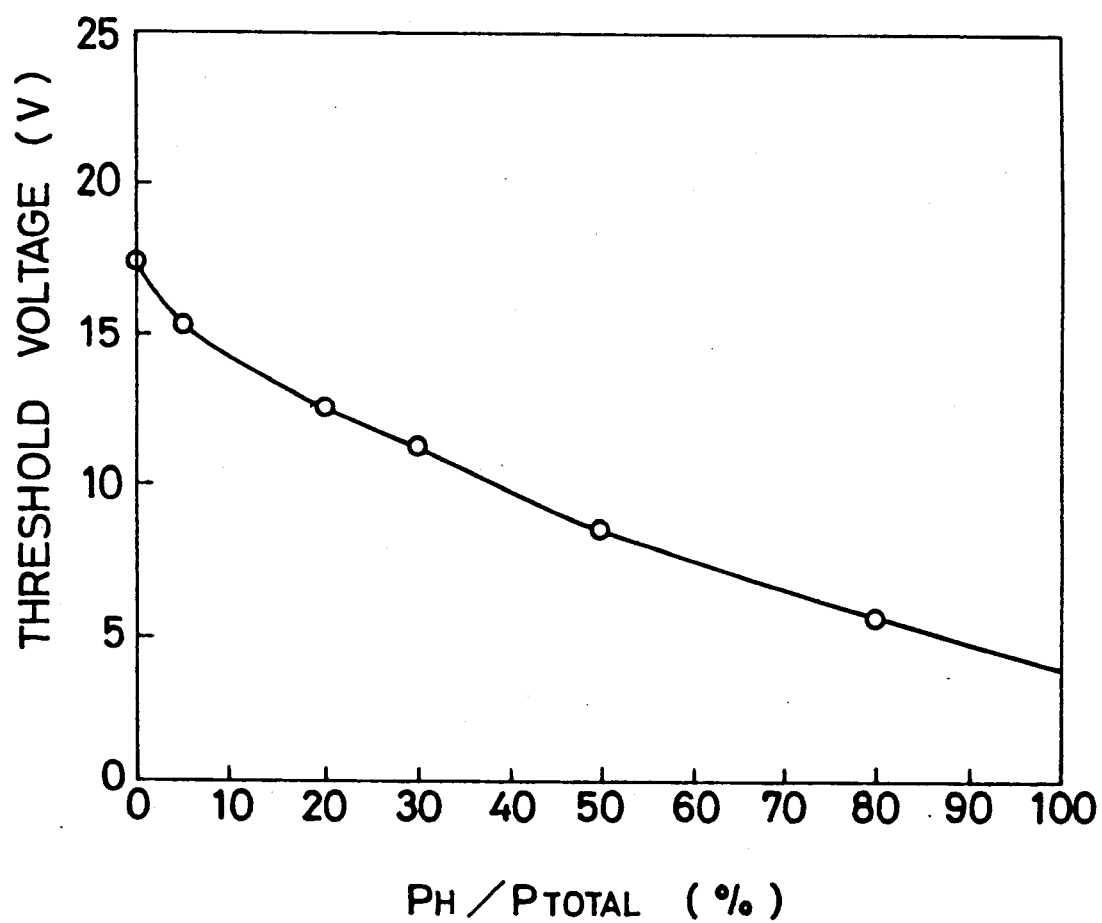
FIG. 3(B) is a graphical diagram showing the relationship between the partial pressure of hydrogen in the atmosphere in which semiconductor films are deposited and the threshold voltage of the transistor consisting of the semiconductor film.
Figure 4:
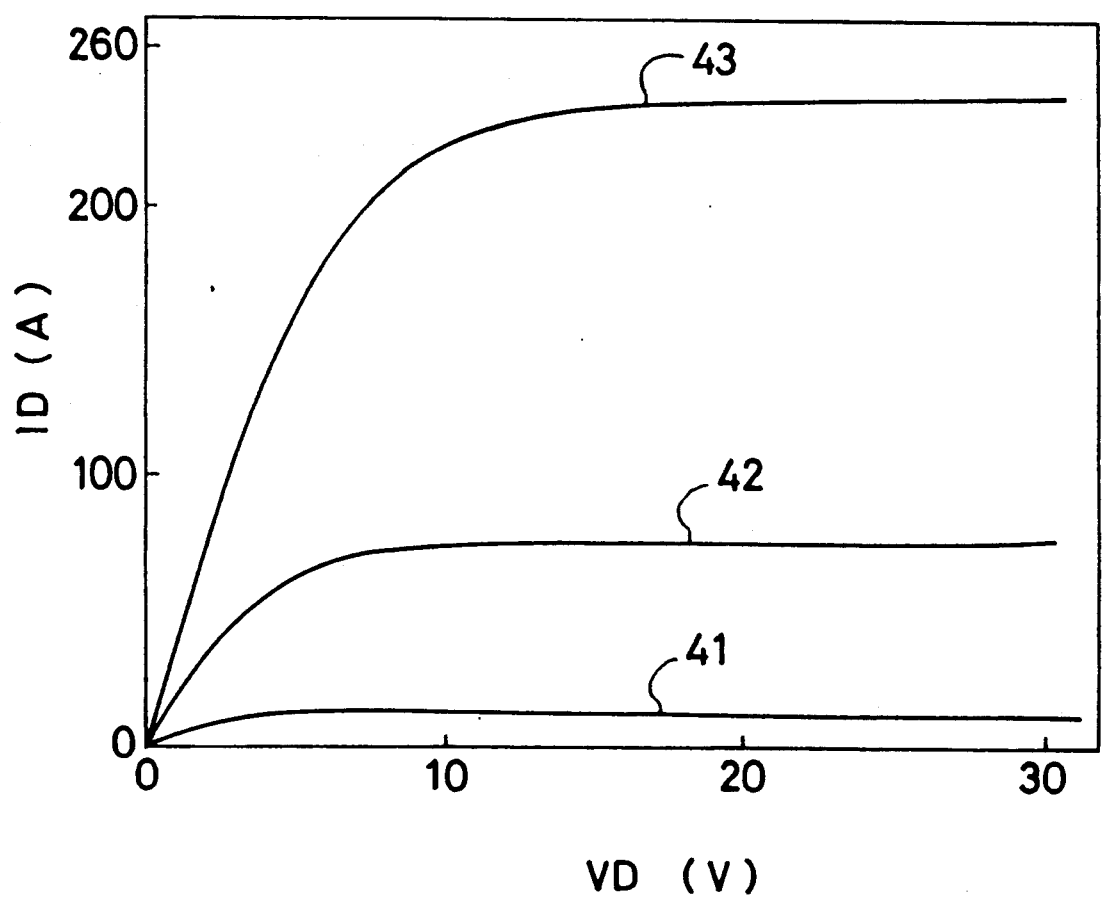
FIGS. 4 to 8 are graphical diagrams showing the relationship between the drain current and the drain voltage of field effect transistor.
Figure 5:
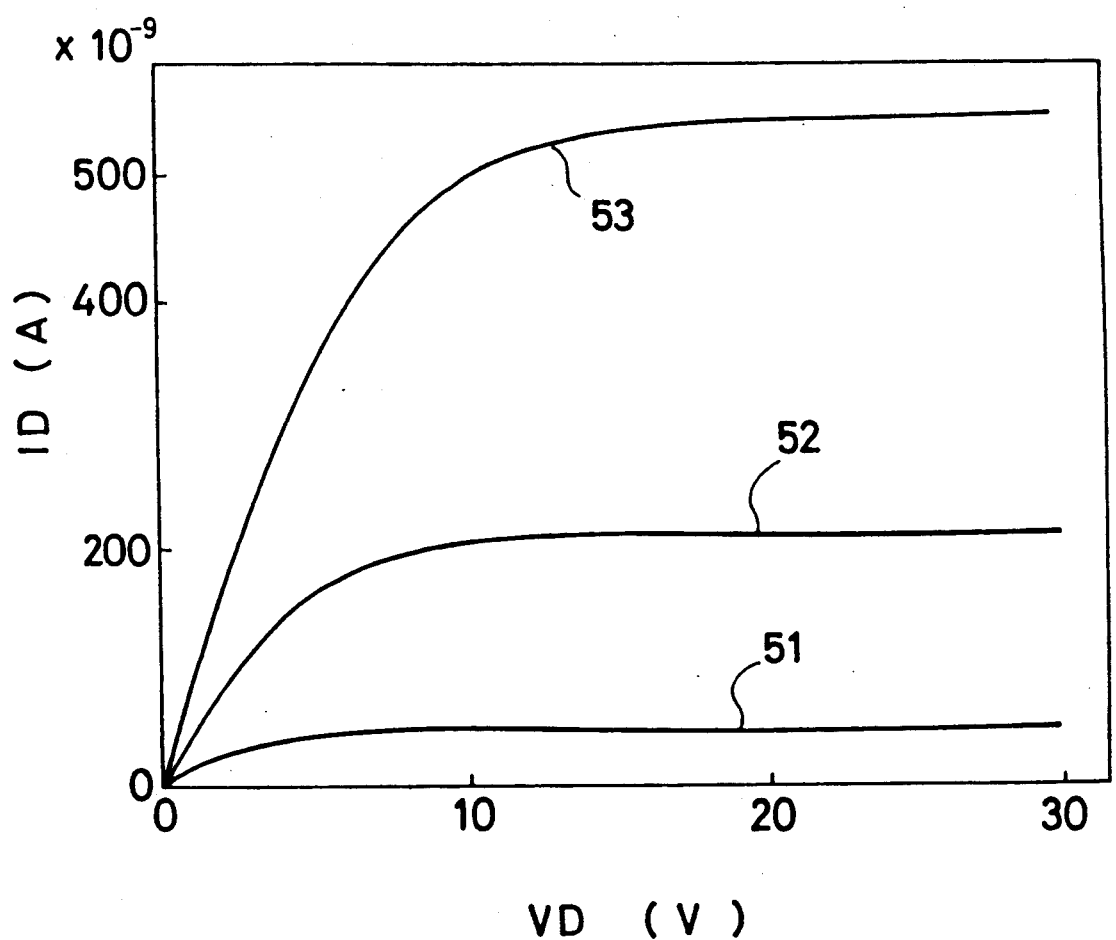
Figure 6:
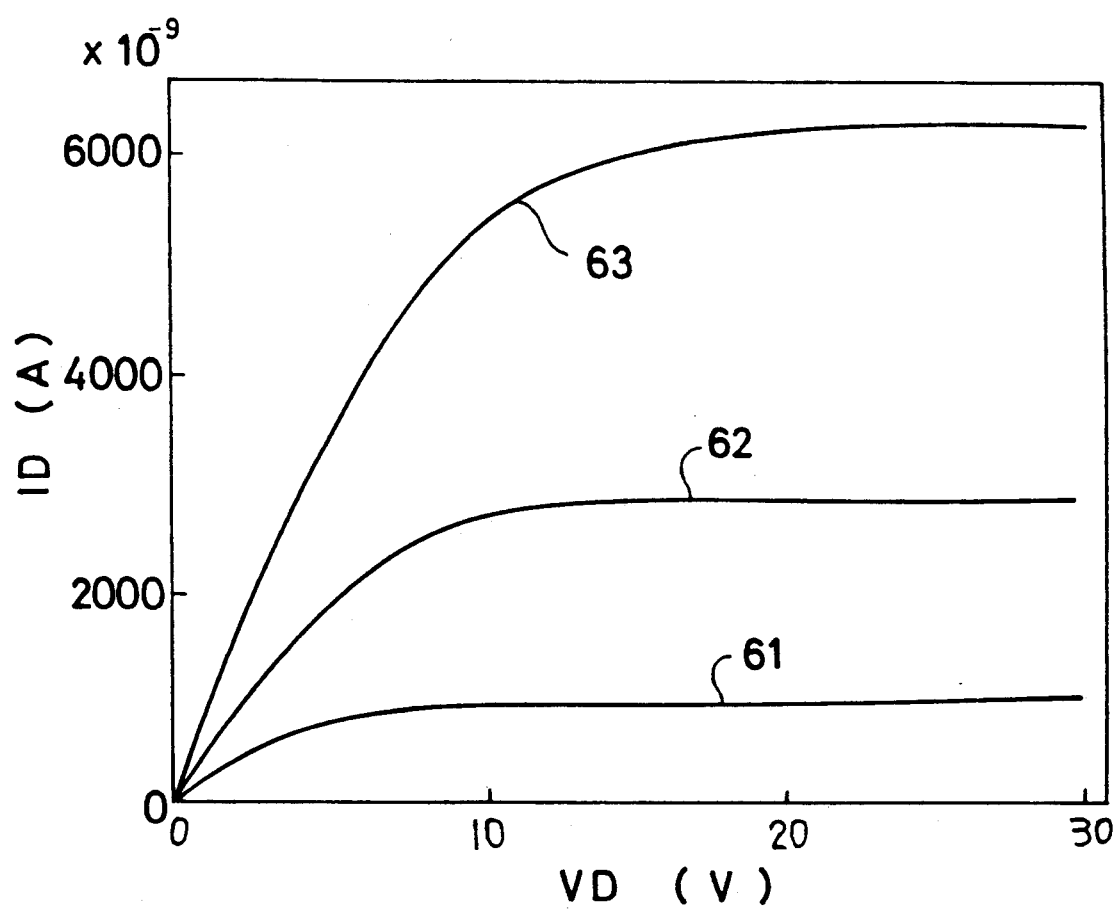
Figure 7:
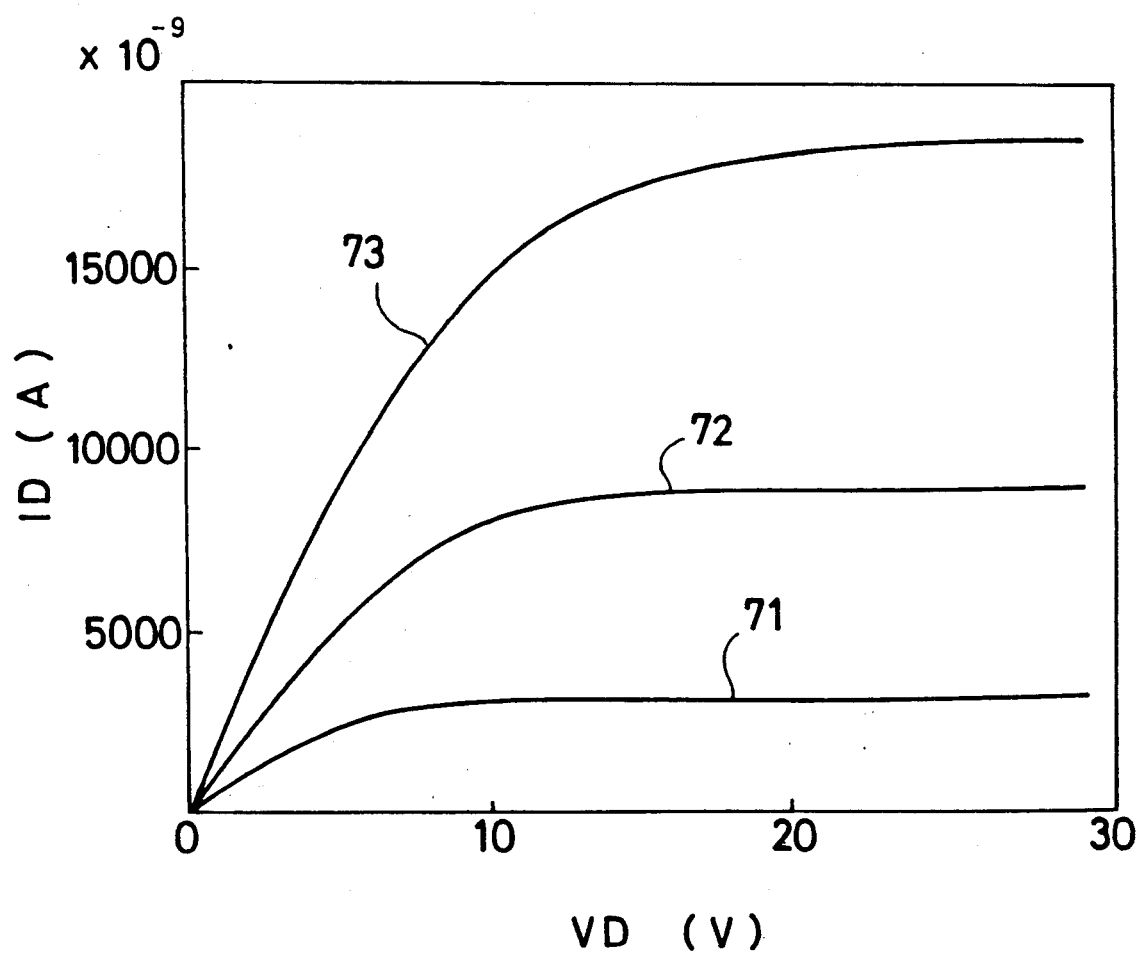
Figure 8:
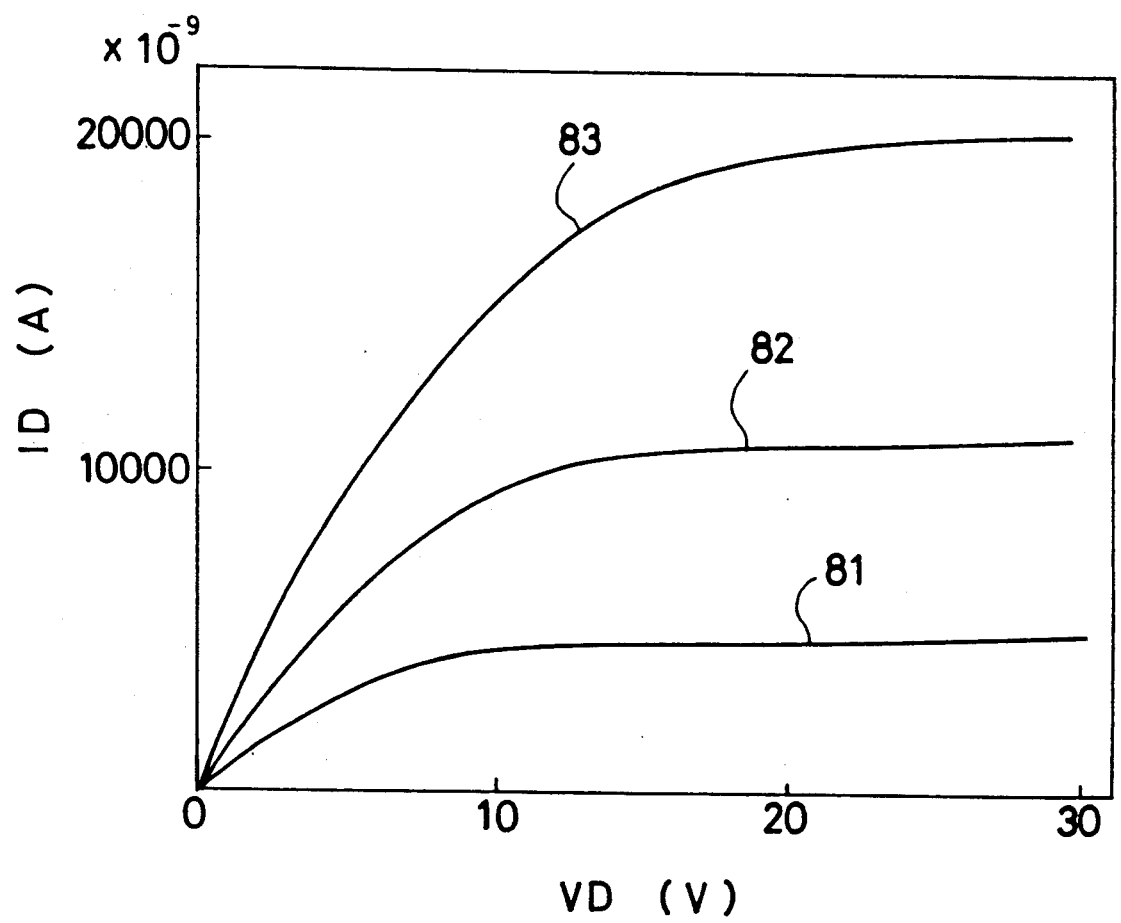

The above procedure was repeated with changing the deposition condition of the semiconductor film 13 for reference. The proportion of hydrogen of the hydrogen/Ar mixture atmosphere was changed to be $H_2/(H_2+Ar)=0, 0.05, 0.2, 0.3, 0.5$, and 0.8 respectively in term of partial pressure. FIG. 3(A) is a graphical diagram showing the field mobility versus the proportion ($P_H/P_{TOTAL}=H_2/(H_2+Ar)$). In accordance with this diagram, high values of the field mobility can be attained if the hydrogen proportion is no lower than 20%. FIG. 3(B) is a graphical diagram showing the threshold voltage versus the hydrogen proportion. As shown from this diagram, threshold voltages of transistors comprising channel regions formed by depositing amorphous silicon film through sputtering carried out in a hydrogen atmosphere and giving the amorphous silicon film a thermal treatment is decreased as the hydrogen proportion is increased. The electric characteristics tend to be improved as the hydrogen proportion is increased since operating voltage, that is gate voltage, of the transistor can be small when the threshold voltage is small.

FIGS. 4 to 8 are graphical diagrams showing the relationship between the drain current and the drain voltage. The proportion of hydrogen of the hydrogen/Ar mixture atmosphere, i.e. $H_2/(H_2+Ar)$, were 0 (FIG. 4), 0.05 (FIG. 5), 0.2 (FIG. 6), 0.3 (FIG. 7) and 0.5 (FIG. 8) respectively in term of partial pressure. Curves 41, 51, 61, 71, and 81 correspond to the case that measurement was done with the application of 20 V at the gate electrode. Curves 42, 52, 62, 72, and 82 correspond to the case that the measurement was done with the gate electrode being at 25 V. Curves 43, 53, 63, 73, and 83 correspond to the case that with the electrode at 30 V. The conspicuous effect of the present invention is apparent when curve 53 is compared to curve 63, that the drain current in the case of the hydrogen proportion being 0.2 was larger than that of the hydrogen proportion being 0.05 by a factor of 10 or more. This means that the characteristics of transistors are significantly improved when the proportion of hydrogen in the atmosphere in which the amorphous silicon film 13 is deposited is increased from 5% to 20%. This is confirmed also by the following experiments.

Figure 9:
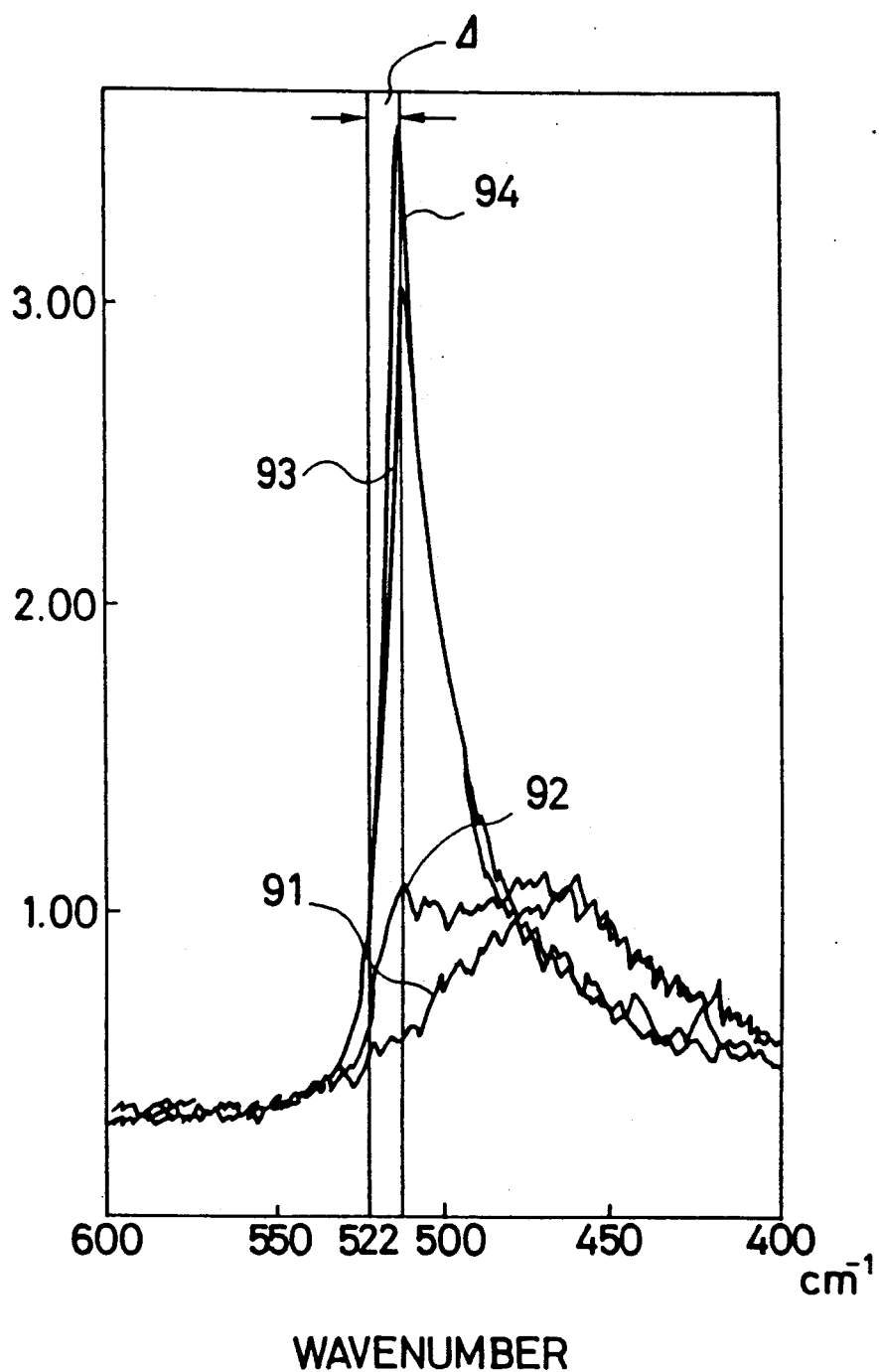
FIG. 9 is a graphical diagram showing Raman spectra of the semiconductor films deposited under several deposition conditions.

The proportion of hydrogen of the hydrogen/Ar mixture atmosphere in which the channel region was deposited was changed to be $H_2/(H_2+Ar)=0, 0.05, 0.2$, and 0.5 respectively in term of partial pressure. FIG. 9 is a graphical diagram showing Raman spectra of the semiconductor film 13 after the thermal treatment. The proportions of hydrogen of the hydrogen/Ar mixture atmosphere, i.e. $H_2/(H_2+Ar)$, were 0 (curve 91), 0.05 (curve 92), 0.2 (curve 93) and 0.5 (curve 94) respectively in term of partial pressure. As shown in the diagram, the crystallinity was conspicuously enhanced when the hydrogen proportion was increased to 20% (curve 93) as compared with the case of 5% (curve 92).

Referring to FIGS. 6, 7, and 8 again, it is understood that the drain current increases as the hydrogen proportion increases by comparing curves 63, 73, and 83 with each other. The drain current ID is expressed by the following equation when the drain voltage VD is low (Solid State Electronics, Vol. 24, No. 11, p. 1059, 1981, printed in Britain).

$$ID=(W/L)\mu C(VG-VT)VD \qquad (16\text{-}1)$$

In the above equation, W is the channel width of the transistor; L is the channel length; $\mu$ is the carrier mobility; C is the static capacity of the gate insulating oxide film; VG is the gate voltage; and VT is the threshold voltage. Curves plotted in FIGS. 4 to 8 can be expressed by the equation in the vicinity of the origin. The carrier mobility $\mu$ and the threshold voltage VT are determined by giving the hydrogen proportion in the atmosphere whereas the values W, L, and C are determined by the geometric design of the transistor. Accordingly, the variables of the equation are ID, VG, and VD. Since, in FIGS. 4 to 8, curves are plotted with the variable VG being fixed, they are considered as two-variable functions expressed by the equation in the vicinity of the origin. The equation (16-1) suggests that the gradient of each curve plotted in FIGS. 4 to 8 near the origin increases as the threshold voltage VT decreases and the mobility $\mu$ increases. This is apparent when comparing FIGS. 4 to 8 to each other with reference to the VT and $\mu$ of the respective cases which are shown in FIGS. 2 and 3. The equation also teaches the dependency of electric characteristics of the thin film transistor upon the VT and $\mu$ so that the device characteristics can not be determined only by one of FIGS. 2 and 3. When the gradients near origin of the respective curves plotted in FIGS. 4 to 8 are compared with each other for this reason, it is concluded that the hydrogen proportion should be not smaller than 20%, preferably 100%.

This is understood from the following consideration. Comparing FIGS. 4 to 8 with each other, the drain current increases as the hydrogen proportion increases toward 100% when the amorphous silicon film 13 is deposited by sputtering. This is apparent when comparing curves 43, 53, 63, 73, and 83.

The following is data showing the effects of the present invention.

| H$_2$ proportion | S | VT | $\mu$ | on/off ratio |
| --- | --- | --- | --- | --- |
| 0 | 3.1 | 17.5 | 0.30 | 5.4 |
| 5 | 2.8 | 15.4 | 0.46 | 5.7 |
| 20 | 2.4 | 12.6 | 3.41 | 6.7 |
| 30 | 2.0 | 11.4 | 8.39 | 6.9 |
| 50 | 1.7 | 8.7 | 6.76 | 6.9 |
| 80 | 0.97 | 5.8 | 5.04 | 6.2 |

In the above data, H$_2$ proportion is the hydrogen proportion as discussed supra. S is the minimum value of $[d(ID)/d(VG)]^{-1}$ of the drain current ID as a function of the gate voltage VG in the vicinity of origin. A smaller S indicates sharper rise of the ID-VG function and better electric characteristics of the transistor. VT is the threshold voltage. The "$\mu$" is the carrier mobility in units of cm$^2$/V·s. The "on/off ratio" is the logarithm of the ratio of the drain current ID with VG being at 30 V to the minimum value of the drain current ID when the drain voltage is fixed at 10 V. From the data, it is understood as being preferred to choose a 80% or more proportion of hydrogen in the atmosphere.

Figure 10:
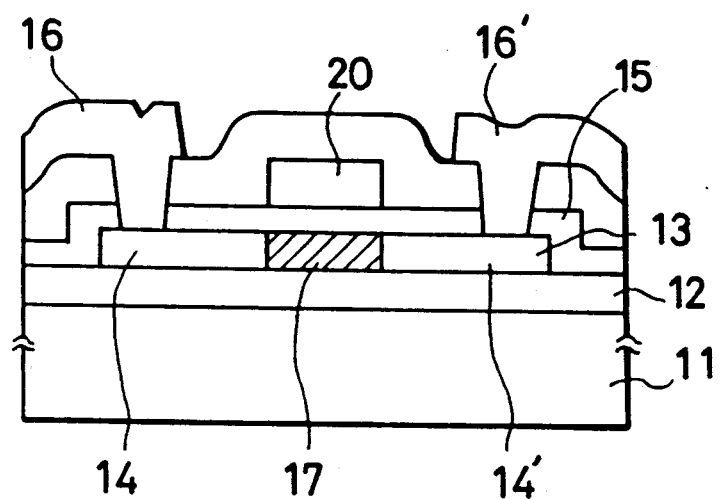
FIGS. 10(A) and 10(B) are cross sectional views showing thin film field effect semiconductor transistors formed in accordance with second and third embodiments of the present invention.
Figure 10:
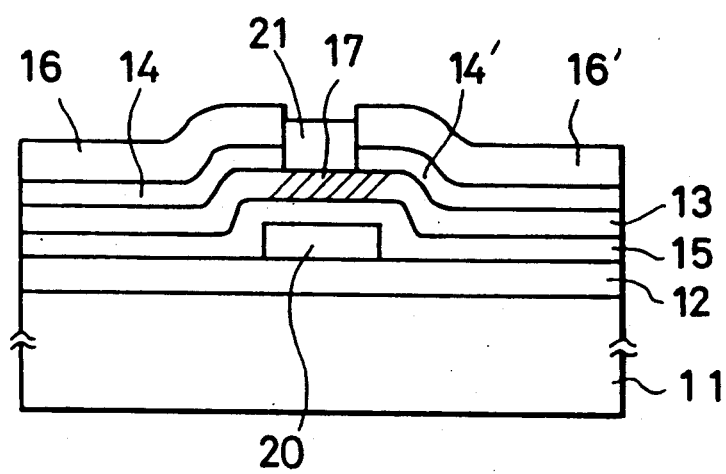

Referring now to FIG. 10(A), a thin film field effect transistor in accordance with a second preferred embodiment of the present invention will be described. The deposition, the patterning and the thermal treatment of the insulating film 12 and the amorphous silicon film 13 are carried out in the same manner as the first embodiment. The entire structure is then coated with a 100 nm thick silicon oxide film 15 by sputtering in an oxide atmosphere as described above. On the silicon oxide film 15 is deposited a polysilicon film which is highly doped with phosphorus followed by photolithography with a suitable mask in order to form a gate electrode 20.

With the gate electrode 20 or the mask used for forming it as a mask, self-aligned impurity regions. i.e. a source and a drain region 14 and 14' are formed by ion implantation. The intermediate region 17 of the silicon semiconductor film 13 between the impurity regions 14 and 14' is then defined as a channel region. An interlayer insulating film is coated over the entire surface of the structure followed by etching for opening contact holes in the interlayer film and the oxide film 15 in order to provide accesses to the underlying source and drain regions 14 and 14'. Finally, an aluminum film is deposited on the structure over the contact holes and patterned to form source and drain electrodes 16 and 16'. In accordance with this embodiment, since the source and drain regions and the channel region are formed in a same semiconductor film so that the process can be simplified and the carrier mobility in the source and drain regions is improved because of the crystallinity of the semiconductor film 13.

Referring to FIG. 10(B), a thin film field effect transistor in accordance with a third preferred embodiment of the present invention will be described. The deposition of the insulating film 12 is carried out in the same manner as the first embodiment. Next, however, a gate electrode 20 is formed by depositing and patterning a molybdenum film of a thickness of 3000Å as opposed to the case of the first embodiment.

The entire surface of the structure is then coated with a silicon oxide film 15 to a thickness of 100 nm by magnetron RF sputtering. The atmosphere comprises a high density oxygen diluted with an inactive gas, preferably. 100% oxygen at 0.5 Pa: the output power of the apparatus is 400 W in terms of 13.56 MHz RF energy: a single crystalline silicon or an artificial quarts is used as a target: and the substrate temperature is maintained at 100° C. When pure oxygen (100% oxygen) is used as the atmosphere, the interface state density of the gate insulating film can be decreased so that excellent transistor characteristics are realized.

An amorphous silicon film is deposited in the sputtering apparatus on the silicon oxide film 15 to a thickness of 100 nm. The atmosphere comprises a mixture consisting of hydrogen and argon so that H$_2$(H$_2$+Ar)=0.8 in terms of partial pressure. The total pressure is 0.5 Pa: the output power of the apparatus is 400 W in terms of 13.56 MHz RF energy: a single crystalline silicon is used as a target: and the substrate temperature is maintained at 150° C. in the same manner. The amorphous silicon film is then given thermal treatment at 450° C. to 750° C., typically at 600° C. for 10 hours in a hydrogen or an inactive atmosphere, e.g. in 100% nitrogen. The film is recrystallized by this treatment to be polycrystalline. In accordance with experiments, it was confirmed by SIMS analysis that oxygen, carbon and hydrogen atoms were involved respective at $1 \times 10^{20} cm^{-3}$, $4 \times 10^{18} cm^{-3}$ and no higher than 5%. These figures of density were minimum values of the respective elements which varied along the depth direction. Thus, a channel region 17 is formed on the gate electrode 20 through the gate insulating film 15.

Next, an n+-type amorphous silicon semiconductor film is deposited on the film 13 in the magnetron RF sputtering apparatus to a thickness of 50 nm. The atmosphere comprises a mixture consisting of $H_2$ at 10% to 99% or more, e.g. 80%, Ar at 10% to 99%, e.g. 20% in terms of partial pressure. The total pressure is 0.5 Pa: the output power of the apparatus is 400 W in terms of 13.56 MHz RF energy: a single crystalline silicon doped with phosphorus is used as a target: and the temperature in the apparatus is maintained at 150° C. The entire surface of the structure is coated with an aluminum film. The aluminum film and the n+-type film are patterned to form source and drain regions 14 and 14' and source and drain electrodes 16 and 16'. A channel region 17 is defined just below a gap between the source and the drain regions 14 and 14'. The gap is filled with an insulator 21 for protecting the channel region 17.

In accordance with the third embodiment, since the gate insulating film 15 is formed in advance of the formation of the semiconductor film 13 forming the channel 17, the interface between the insulating film 15 and the channel 17 is readily thermal annealed so that the interface state density can be decreased.

The foregoing description of preferred embodiments has been presented for purposes of illustration and description. It is not intended to be exhaustive or to limit the invention to the precise form described, and obviously many modifications and variations are possible in light of the above teaching. The embodiment was chosen in order to explain most clearly the principles of the invention and its practical application thereby to enable others in the art to utilize most effectively the invention in various embodiments and with various modifications as are suited to the particular use contemplated. Examples are as follows.

The present invention can be applied to transistors utilizing other types of semiconductors such as germanium or silicon/germanium ($Si_x Ge_{1-x}$) semiconductors, in which case the thermal treatment can be done at temperatures approx. 100° C. lower than those used in the above embodiments. The deposition of such semiconductor can be carried out by sputtering in a high energy hydrogen plasma caused by optical energy (shorter than 1000 nm wavelength) or electron cyclotron resonance (ECR). In this case, positive ions can be effectively produced so that the formation of microstructure in the semiconductor film thus deposited is further prevented. Instead of gases including hydrogen molecules, some hydrogen compounds can be used as the atmosphere of sputtering as long as not to be impurity. For example, monosilane or disilane may be used for forming silicon semiconductor transistors, and a halogen may be used.

What is claimed is:

1. A method of manufacturing a semiconductor device comprising the steps of:
    forming a non-single crystal semiconductor film layer on an insulating substrate by sputtering in an atmosphere comprising hydrogen and an inert gas where a proportion of the hydrogen in the atmosphere is not lower than 20 volume %;
    crystallizing said non-single crystal semiconductor film layer by heating the film layer to form a semiconductive current path connecting a current source region which is adapted for connection to an external source of current and a current drain region adapted for connection to a receiver of current, so that said current path conveys current from said current source region to said current drain region; and
    forming said current source region and said current drain region at opposite ends of the crystallized film layer.

2. The method of claim 1 wherein said non-single crystal semiconductor film comprises a material selected from the group consisting of an amorphous semiconductor, a semi-amorphous semiconductor, a microcrystal semiconductor, and an imperfect polycrystal semiconductor.

3. The method of claim 1 wherein the step of crystallizing said non-single crystal semiconductor film layer is carried out at a temperature of 450° C. to 750° C.

4. The method of claim 1 wherein said inert gas comprises a gas selected from the group consisting of argon and helium.

5. The method of claim 1 wherein said semiconductor film comprises silicon.

6. A method of manufacturing an insulated gate field effect transistor comprising the steps of:
    forming a non-single crystal semiconductor film on an insulating substrate by sputtering in an atmosphere comprising hydrogen and an inert gas where a proportion of the hydrogen in the atmosphere is not lower than 20 volume %;
    crystallizing said non-single crystal semiconductor film by heating said film;
    forming a gate electrode adjacent to said non-single crystal semiconductor film with a gate insulator therebetween so that a channel region is defined by said gate electrode where said gate electrode may be formed either before the formation of said non-single crystal semiconductor film or after crystallizing said non-single crystal semiconductor film; and
    forming source and drain semiconductor regions adjacent to said channel region.

7. The method of claim 6 wherein said source and drain regions are formed by forming a doped semiconductor pattern coated on said semiconductor film in advance of the step of forming the insulating film.

8. The method of claim 6 wherein the step of crystallizing said non-single crystal semiconductor film layer is carried out at a temperature of 450° C. to 750° C.

9. The method of claim 6 wherein said inert gas comprises a gas selected from the group consisting of argon and helium.

10. The method of claim 6 wherein said semiconductor film comprises silicon.

11. The method of claim 6 wherein said atmosphere further comprises a gas selected from the group consisting of monosilane and disilane.

12. The method of claim 6 wherein said non-single crystal semiconductor film comprises a material selected from the group consisting of an amorphous semiconductor, a semi-amorphous semiconductor, a microcrystal semiconductor, and an imperfect polycrystal semiconductor.

13. The method of claim 6 wherein said source and drain regions are formed by ion implantation with said gate electrode as a mask.

14. The method of claim 6 wherein said source and drain regions are formed by ion implantation with a mask used for forming said gate electrode as a mask.

15. A method of manufacturing an insulated-gate field effect transistor comprising the steps of:
   forming a non-single crystal semiconductor film on an insulating substrate by sputtering in an atmosphere comprising hydrogen and an inert gas;
   crystallizing said non-single crystal semiconductor film; and
   annealing said crystallized non-single crystal semiconductor film in a hydrogen containing atmosphere.

16. The method of claim 15 wherein said source and drain regions are formed by forming a doped semiconductor patterned film coated on said semiconductor film except on said channel region.

17. The method of claim 15 wherein a proportion of the hydrogen in said atmosphere is not lower than 20%.

18. The method of claim 16 wherein said inert gas comprises a gas selected from the group consisting of argon and helium.

19. The method of claim 15 wherein said non-single crystal semiconductor film comprises a material selected from the group consisting of an amorphous semiconductor, a semi-amorphous semiconductor, a microcrystal semiconductor, and an imperfect polycrystal semiconductor.

20. The method of claim 15 wherein said semiconductor film comprises silicon.

21. The method of claim 15 wherein said method further comprises the steps of forming a gate electrode, a gate insulator, source and drain regions, before the step of annealing said crystallized non-single crystal semiconductor film in the hydrogen containing atmosphere.

* * * * *